United States Patent [19]
Groe

[11] Patent Number: 6,094,571
[45] Date of Patent: *Jul. 25, 2000

[54] DIFFERENTIAL CLASS AB MIXER CIRCUIT

[75] Inventor: John B. Groe, Poway, Calif.

[73] Assignee: Nokia Mobile Phones Ltd., Espoo, Finland

[ * ] Notice: This patent issued on a continued prosecution application filed under 37 CFR 1.53(d), and is subject to the twenty year patent term provisions of 35 U.S.C. 154(a)(2).

[21] Appl. No.: 09/165,869

[22] Filed: Oct. 2, 1998

[51] Int. Cl.[7] .............. H04B 1/28; H03B 19/00

[52] U.S. Cl. .............. 455/333; 455/315; 455/209; 455/326; 455/253.2; 455/293; 330/252; 327/359

[58] Field of Search .............. 455/315, 207, 455/209, 264, 260, 265, 295, 296, 333, 319, 325, 326, 144, 194.2, 253.2, 293; 330/252, 257; 327/359

[56] References Cited

U.S. PATENT DOCUMENTS

| 5,001,372 | 3/1991 | Nyqvist | 307/529 |
| 5,166,645 | 11/1992 | Watts | 455/333 |
| 5,428,836 | 6/1995 | Sanecki et al. | 455/315 |
| 5,642,071 | 6/1997 | Sevenhans et al. | 455/333 |
| 5,675,392 | 10/1997 | Nayebi et al. | 348/584 |
| 5,884,154 | 3/1999 | Sano et al. | 455/333 |

*Primary Examiner*—Fan Tsang
*Assistant Examiner*—Simon Nguyen
*Attorney, Agent, or Firm*—Robert H. Kelly; Holland & Hart LLP

[57] ABSTRACT

A mixer circuit, and an associated method, mixes together differential input signals with differential mixing signals to form differential output signals. The differential output signals are substantially linearly related to the input signals over an entire range of input signal values. The mixer circuit forms, in exemplary implementations, portions of a radio receiver device or a radio transmitter device, such as the radio receiver and transmitter portions of a cellular radio telephone.

10 Claims, 3 Drawing Sheets

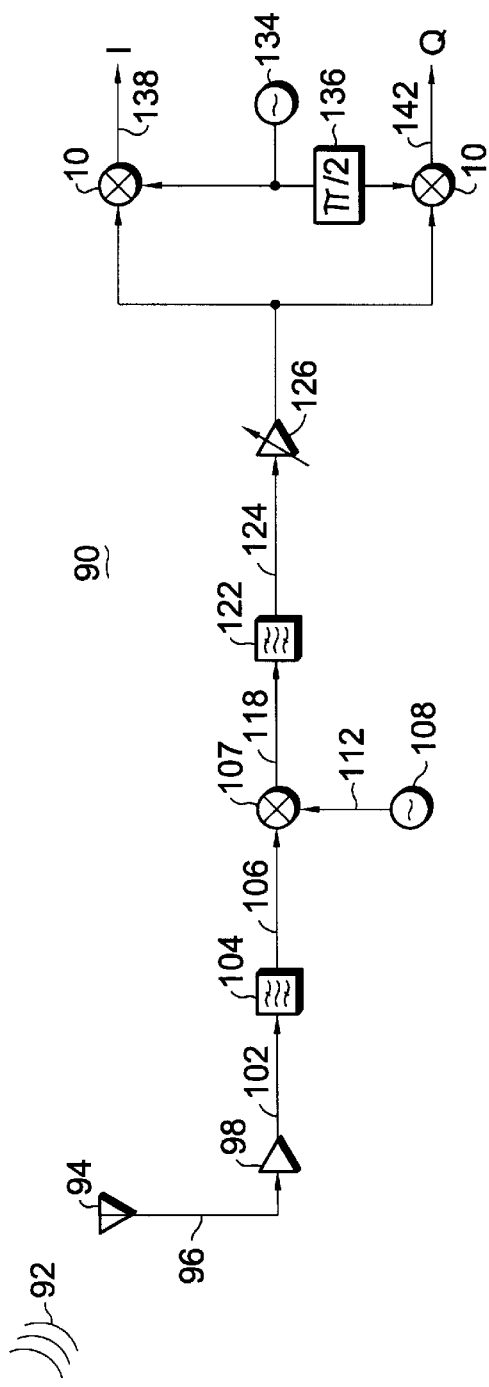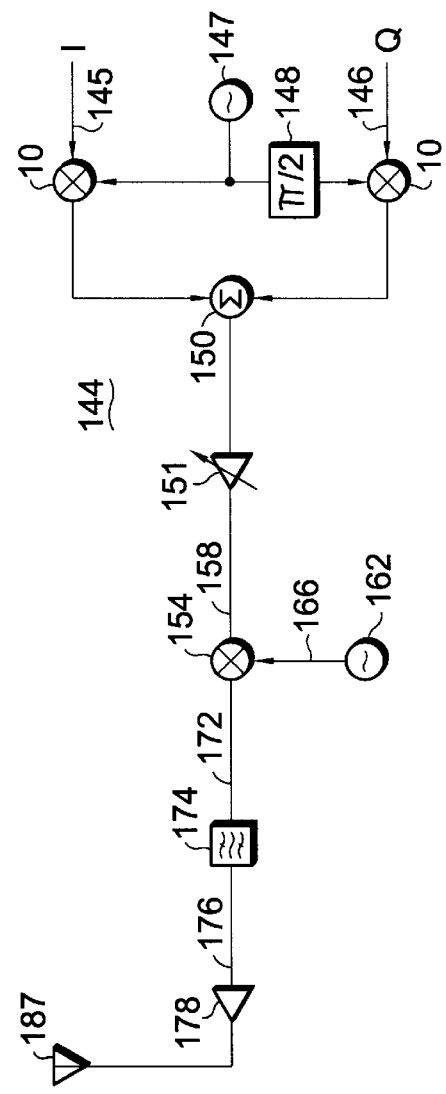
FIG. 4
FIG. 5

DIFFERENTIAL CLASS AB MIXER CIRCUIT

The present invention relates generally to a mixer circuit, such as a mixer circuit forming a portion of a radio, or other communication device, used to up-mix or down-mix the frequency of an input signal. More particularly, the present invention relates to a differential mixer circuit, and an associated method, which forms differential output signals. The associated differential output signals are more linearly related to the input signals, and output levels of the differential signals are not as current-limited, in contrast to conventional mixer circuits. Also the linear relationship between output and input signals is maintained over a substantially wider range of input signal values provided to the mixer circuit than that possible through the use of conventional mixer circuits.

BACKGROUND OF THE INVENTION

Advancements in communication technologies has permitted the implementation, and popular usage, of multi-user radio communication systems. A cellular communication system is exemplary of such a radio communication system. Information signals generated during operation of a radio communication system are transmitted upon radio communication channels.

To convert the information signal into a form to permit its communication upon a communication channel defined in a radio communication system, a transmitting station modulates the information signal upon a carrier wave of a carrier frequency within the range of frequencies which defines, at least in part, the communication channel. Thereby, a baseband-level signal of which the information signal is formed is converted into a radio frequency signal corresponding to the frequency of the communication channel upon which the resultant, communication signal is to be transmitted to a receiving station.

A transmitter includes one or more up-mixing stages at which the baseband, information signal is up-converted in frequency to be of the selected radio frequency. The mixing stages include mixer circuits coupled to receive the information signal and an up-mixing signal with which the information signal is to be multiplied or otherwise combined to form an up-converted signal. When multiple mixing stages are utilized, an IF (intermediate frequency) signal is formed at a first, or first series, of the mixer stages. A radio frequency signal is formed at the final mixing stage.

The receiving station which receives a radio-frequency, communication signal transmitted thereto upon the radio communication channel must, analogously, convert the radio frequency signal to a baseband level. One or more down-conversion stages is utilized to down-convert the radio frequency signal to a baseband-level. Typically, an antenna transducer converts the radio-frequency communication signal transmitted upon the communication channel into electrical form. When initially converted into electrical form, the signal is of small amplitude. Amplifier elements forming a portion of the receiver of the receiving station amplify the received signal. Because of the amplification of the received signal, during down-conversion, such as at an IF stage of the receiver, the elements of the receiver must exhibit highly linear characteristics to ensure proper operation of the receiver.

Sensitivity and selectivity of a receiver define, in part, the performance of the receiver.

Sensitivity is the ability of a communications receiver to recover information in the presence of noise. The sensitivity of the receiver depends upon, inter alia, a noise figure, information bandwidth, and carrier-to-noise ratio requirements of a digital demodulator, forming a portion of the receiver. The noise figure is set by the front-end down converter of the receiver.

Selectivity is the ability of the receiver to isolate information amongst interfering signals. The selectivity of the receiver is determined by channel filtering and signal handling.

Conventional receivers include, for example, an active mixer for converting an IF receive signal to a baseband level. Such an active mixer forms, for example, a portion of an IQ demodulator. The active mixer of a conventional receiver is sometimes formed of a quad mixer, or Gilbert Cell mixer. However, such an existing mixer provides a linear output responsive to an input provided thereto over a relatively small range of input signals. If the input to the mixer is beyond the allowable range, the output of the mixer no longer is linearly related to the input. Performance of the receiver including such a mixer is hampered by the non-linearity of the mixer.

A mixer circuit which exhibits improved linearity characteristics would advantageously improve radio performance of a radio device.

It is in light of this background information related to mixer circuits that the significant improvements of the present invention have evolved.

SUMMARY OF THE INVENTION

The present invention, accordingly, advantageously provides a differential mixer circuit, and an associated method, of improved characteristics relative to conventional differential mixer circuits. Differential output signals are generated in which combinations thereof are more linearly related to input signals applied to the mixer circuit. The input signals are mixed together with local oscillator signals during operation of an embodiment of the present invention to form the differential output signals. Signal levels of the differential output signals are not as current-limited as output signals generated by conventional mixer circuits, and therefore the combinations thereof exhibit a more linear relationship to the input signals over a broad range of input signal values.

Improved performance of a device, such as a radio receiver or radio transmitter, containing a mixer circuit of an embodiment of the present invention is possible. The mixer circuit generates differential outputs of which combinations thereof are more linearly related to input signals provided thereto, than generally possible through the use of conventional mixer circuits which exhibit linear relationships over only a limited voltage range of input signals. Additionally, the differential output signals are further of characteristics permitting generation of a larger output load voltage, also to improve performance of the device of which the mixer circuit forms a portion.

In one implementation, the mixer circuit forms a portion of an IF (intermediate frequency) section of a radio receiver, such as the radio receiver of apparatus utilized in a cellular communication system. IF signals representative of a receiver signal are applied in differential form, to the mixer circuit. Down-mixing local oscillator signals are also applied to the mixing circuit, and the mixing circuit is operable to generate a baseband signal. The baseband signal is then provided, for instance, to an I/Q demodulator to be processed threat.

In another implementation, the mixer circuit of an embodiment of the present invention forms a portion of a transmitter, such as a transmitter operable in a cellular communication system. Differential, IF or baseband, transmit signals are applied to the mixer circuit together with an up-mixing signal. The mixer circuit generates up-mixed, differential signals which together are more linearly related to the differential, IF or baseband, input signals provided thereto. The signal levels of the up-mixed signals are not as current-limited, in contrast to up-mixed signals generated by conventional mixer circuits. Improved linearity characteristics and an ability to drive higher-voltage loads permits a transmitter of improved characteristics to be formed.

In these and other aspects, therefore, a differential mixer circuit, and an associated method, mixes together an input signal with a mixing signal to form an output signal. A pair of amplifiers forming an amplifying stage in which each amplifier is coupled to receive a complementary version of a differential input signal. The amplifying stage generates an amplified signal set. The amplifiers of the amplifying stage each has a separate degeneration resistor connected between the transistor stage and a common potential. A multiplying stage is coupled to receive indications of the amplified signal set generated by the amplifying stage and to receive the mixing signal. The multiplying stage multiplies together the mixing signal and the amplified signals of the amplified signal set. Products thereof form the output signal. The output signal is formed of a differential output signal set. A combination of the output signals of the differential output signal set are together more linearly related to the differential input signal set than that generally possible through the use of a conventional differential mixer circuit.

A more complete appreciation of the present invention and the scope thereof can be obtained from the accompanying drawings which are briefly summarized below, the following detailed description of the presently-preferred embodiments of the present invention, and the appended claims.

BRIEF DESCRIPTION OF THE DRAWINGS

FIG. 4 illustrates a functional block diagram of a radio receiver which includes the mixer circuit shown in FIG. 1 as a portion thereof.

FIG. 5 illustrates a radio transmitter which includes the mixer circuit shown in FIG. 1 as a portion thereof.

DETAILED DESCRIPTION

Figure 1:
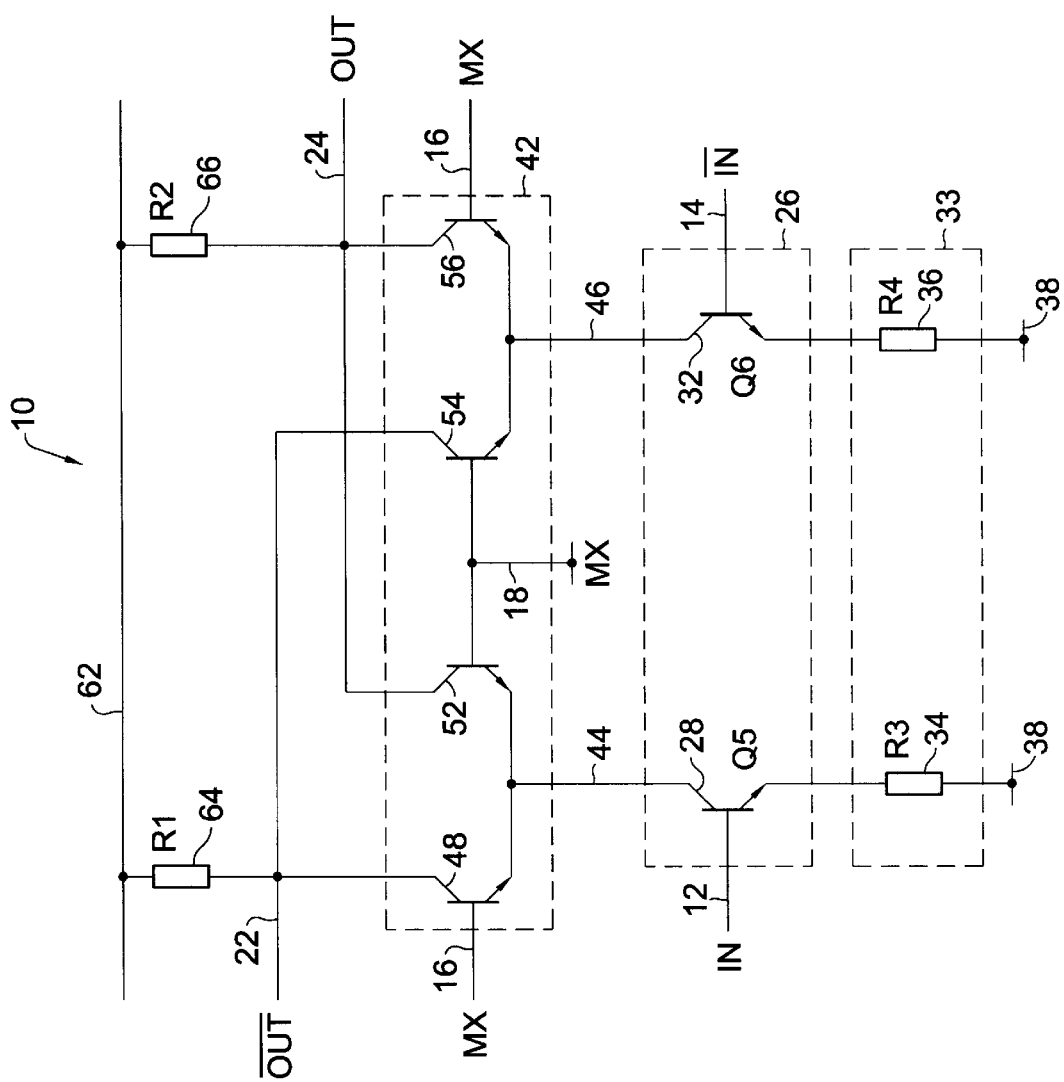
FIG. 1 illustrates a circuit schematic of a mixer circuit of an embodiment of the present invention.

Turning first to FIG. 1, a mixer circuit shown generally at 10, of an embodiment of the present invention is coupled to receive differential input signals on the lines 12 and 14. Differential mixing signals are also provided to the mixer circuit 10 on lines 16 and 18. During operation of the mixing circuit, the differential input signals applied on the lines 12 and 14 are mixed together with the mixing signals generated on the lines 16 and 18. Once mixed together, differential output signals are generated on the lines 22 and 24. Such output signals are thereafter applied to other circuit elements (not shown in the Figure).

The mixing circuit 10 includes a pair of amplifiers forming an amplifying stage 26. The differential input signals generated upon the lines 12 and 14 are provided to the amplifying stage 26. As illustrated, the amplifying stage 26 includes transistors 28 and 32 coupled to receive the differential inputs generated on the lines 12 and 14, respectively. The transistors form the amplifiers of the amplifying stage. In the illustrated embodiment, the transistors 28 and 32 are bipolar junction transistors wherein the line 12 is coupled to the base electrode of the transistor 28, and the line 14 is coupled to the base electrode of the transistor 32. The transistors 28 and 32 are matched transistors, viz., the transistors exhibit corresponding transistor characteristics including corresponding gain characteristics.

Emitter electrodes of the transistors 28 and 32 are coupled to a pair 33 of degeneration resistors 34 and 36, respectively. The resistors 34 and 36 are connected in parallel connections between the amplifying stage 26 and a common potential 38. The arrangement of the degeneration resistors 34 and 36 causes such resistors also to form current source resistors. And, in the exemplary implementation, the transistors 28 and 32, along with degeneration resistors 34 and 36, each form Class AB amplifiers. The transistors form transconductance amplifiers which generate output signals of current levels responsive to input signals of voltage levels applied thereto. Conventional mixer circuits, such as four quadrant multipliers or Gilbert Cell mixer circuits, have a fixed DC bias current. This limits the linearity relationship of output to input signals. The DC bias current of a conventional Gilbert Cell mixer is realized by either a resistor element or a transistor-resistor combination. The current source reduces the possible voltage swing of output voltages for signals generated by the mixer circuit by at least a value corresponding to the voltage drop across the current source. In a Class AB amplifier stage, the DC bias current changes with the input signal—becoming larger for high input values. This effect counteracts the compression effect of linear transistor amplifiers.

The mixer circuit 10 further includes a multiplying stage 42 which is coupled to the collector electrodes of the transistors 28 and 32 by way of the lines 44 and 46, respectively. The multiplying stage 42 includes first and second pairs of transistors 48–52 and 54–56 coupled to the lines 44 and 46, respectively. A first differential mixing signal generated on the line 16 is provided to the base electrodes of the transistors 48 and 56. And, a second differential mixing signal generated on the line 18 is provided to the base electrodes of the transistors 52 and 54.

A first differential output signal generated on the line 24 is formed by the collector electrodes of the transistors 52 and 56 to which the line 24 is coupled. And, the second differential output signal generated by the mixer circuit 10 on the line 22 is generated at the collector electrodes of the transistors 48 and 54 to which the line 22 is coupled. The line 22 together with the collector electrodes of the transistors 48 and 54, are coupled to a common biasing line 62 by way of a resistor 64. And, the line 24, together with the collector electrodes of the transistors 52 and 56, is also coupled to the common biasing line 62 by way of the resistor 66.

The mixer circuit 10 mixes together the differential input signals generated on the lines 12 and 14 with the differential mixing signals generated on the lines 16 and 18 to form the differential output signals generated on the lines 22 and 24. When, for instance, the differential input signals provided to the mixer circuit 10 by way of the lines 12 and 14 form IF (intermediate frequency) signals, appropriate selection of the frequency values of the differential mixing signals applied to the mixer circuit 10 by way of the lines 16 and 18 permit the mixer circuit 10 to down-convert the IF signals to baseband levels such that the differential output signals generated on the lines 22 and 24 form baseband-level signals. Analogously, when the differential input signals applied to the mixer circuit 10 on the lines 12 and 14 form baseband-level signals appropriate selection of the differential mixing signals applied to the mixer circuit 10 by way of the line 16 and 18 permit the mixer circuit 10 to up-convert the signals such that the differential output signals generated on the lines 22 and 24 form IF level signals. And, when the differential input signal is applied to the mixer circuit 10 by way of the lines 12 and 14 form IF-value signals, appropriate selection of the mixing signals provided to the mixer circuit 10 on the lines 16 and 1 8 cause the differential output signals generated on the lines 22 and 24 to be of RF (radio frequency) values.

Figure 2:
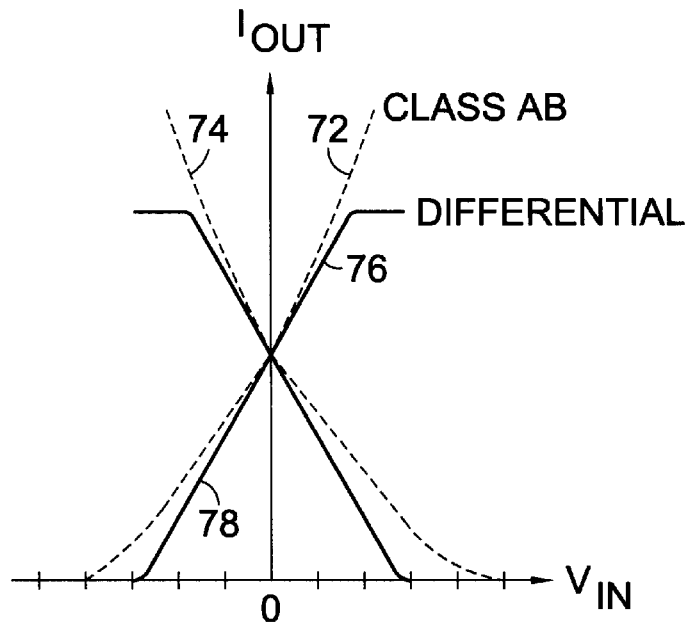
FIG. 2 illustrates a graphical representation of current levels of the differential output signals generated by the mixer circuit shown in FIG. 1 as a function of voltage levels of the differential input signals applied thereto. A corresponding representation of a conventional mixer circuit is further shown in the Figure.

FIG. 2 illustrates the relationship between the voltage levels of the differential input signals applied on the lines 12 and 14 to the mixer circuit 10 and output current levels of the differential output signals generated on the lines 44 and 46 during operation of the mixer circuit. The plot 72 illustrates the relationship of the current levels generated, for instance, on the line 44 as a function of the input voltage of, for instance, the differential input signal applied to the mixer circuit on the line 12. Analogously, the plot 74 represents the current level of the other differential output signal, such as the signal generated on the line 46 as a function of the input voltage of the other differential input signal, such as the signal applied to the mixer circuit 10 by way of the line 14. Combinations of the plot 72 and 74 are more linearly-related to the voltage levels of the differential inputs applied to the mixer circuit. T he differential output signals 22, 24 are just commutated versions of the output signals from the transconductance amplifier stages, output signals 44,46. Because of the substantially linear relationship between the differential input and output signals, the mixer circuit 10 is advantageously utilized to form a portion of a radio device, such as a radio receiver or radio transmitter of a cellular, or other, radio telephone.

FIG. 2 further illustrates plots 76 and 78 of a conventional Gilbert Cell mixer. The plots 76 and 78 also represent the current levels of differential outputs as a function of voltage levels of differential inputs applied to a conventional Gilbert Cell mixer circuit. Analysis of the plots 76 and 78 indicate that the conventional, Gilbert Cell mixer is current-limited at high input voltage levels. When input voltages are beyond such levels, the output current levels of the differential output signals are no longer linearly related to the corresponding input signals. Rather, the output current levels of the differential output signals saturate at the level of the current source.

Figure 3:
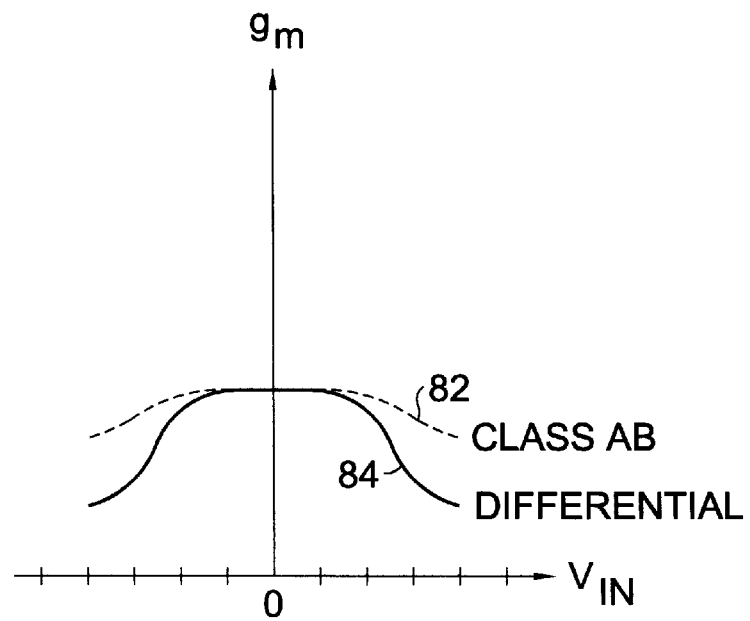
FIG. 3 illustrates a graphical representation of the amplifier gain of the mixer circuit shown in FIG. 1 as a function of the voltage levels of the differential input signals applied to the mixer circuit. A corresponding representation of a conventional mixer circuit is further shown in the Figure.

FIG. 3 illustrates the relationship between the amplifier gain of the mixer circuit 10 relative to the input voltages of differential input signals provided to the mixer circuit 10. The plot 82 plots the amplifier transconductance gain, $g_1n$ for the mixer circuit 10 as a function of the input voltages of the differential input signals provided thereto. The plot 84 is representative of the amplifier gain as a function of differential input voltages of a conventional Gilbert Cell mixer. Comparison of the plots 82 and 84 illustrates the drop-off in gain of a conventional mixer circuit in contrast to the relatively higher gain levels of the mixer circuit 10 at high voltage levels.

FIG. 4 illustrates a radio receiver, shown generally at 90, which includes the mixer circuit 10 of an embodiment of the present invention. The receiver 90 illustrates the components of an exemplary receiver. Other constructions of receivers can analogously include the mixer circuit of an embodiment of the invention. The receiver 90 illustrated in the Figure is representative of the receiver portion of a cellular radio telephone.

Electromagnetic signals 92 transmitted to the radio receiver 90 are detected by an antenna transducer 94 and converted into electrical form on the line 96. The line 96 is coupled to an amplifier 98, operable to amplify the electrical signals representative of the electromagnetic signals 92. Amplified signals are generated on the line 102 and are filtered by a filter 104.

The filter 104 here generates the differential, filtered signals on the lines 106 which are coupled to first inputs of the mixer circuit 107. An oscillator 108 generates differential, oscillating signals on the lines 112 which are also applied to inputs of the mixer circuits 107. In one implementation, the mixer circuit is operable, as described above with respect to the mixer circuit 10, shown in FIG. 1, to generate differential, down-mixed signals on the lines 118. The lines 118 are coupled to a filter 122 which is operable to filter the signals applied thereto and to generate a filtered signal on the line 124.

The filtered signals generated on the line 124 are amplified by a variable amplifier 126, and the amplified signals formed threat are applied to inputs of mixer circuits 10 of a baseband, I/Q demodulator. The mixer circuits 10, in the exemplary implementation, correspond to the mixer circuit 10 described above with respect to FIGS. 1–3. The mixer circuits 10 are also provided with oscillating signals generated by an oscillator 134 in which the oscillating signal applied to the bottom-most (as shown) mixer 10 is offset by a phase-adjuster 136 with a ninety degree phase shift, in conventional fashion. The I/Q demodulator is operable to generate I and Q signals on the lines 138 and 142, respectively.

Because of the improved linearity of operation of the mixer circuit 10, signals generated by the mixer circuits 10 are of improved characteristics relative to corresponding signals generated by existing mixer circuits. Also, the mixer circuits 10 permit the driving of a larger output load voltage in contrast to existing mixer circuits.

FIG. 5 illustrates a radio transmitter, shown generally at 144, of which mixer circuits 10 of an embodiment of the present invention form portions. The transmitter 144 is exemplary, and the mixer circuit 10 analogously can form portions of other constructions of transmitters. Modulated baseband signals in quadrature format are provided to the I/Q modulator by way of lines 145 and 146 representing the I and Q signals, respectively. The I and Q signals are provided to two mixer circuits 10. Transmit mixing signals are generated by the oscillator 147 in which the mixing signal applied to the bottom-most (as shown) circuit 10 is offset by the phase shifter 148. Signals formed by the mixer circuits 10 are combined by a combiner 150 and amplified by variable gain amplifier 151. Amplified signals are then applied to a mixer 154.

An up-mixing signal generated by an oscillator 162 is applied to the mixer 154 by way of the line 166.

The mixer 154 is operable to generate up-mixed signals on the lines 172. In one implementation, the mixer circuit is operable as described above with respect to the mixer circuit 10, shown in FIG. 1. Lines 172 are coupled to a filter 174 which filters the up-mixed signals provided thereto to form a filtered signal on the line 176. The filtered signals generated on the line 176 are amplified by an amplifier 178, and the amplified signals are radiated by the antenna transducer 182.

Through operation of an embodiment of the present invention, differential output signals are formed which are more linearly related to differential input signals. The linear relationship is not as current-limited and, because of the improved linearity characteristics of the mixer circuit, radio, or other, devices of which the mixer circuit forms a portion are of corresponding improved characteristics.

The previous descriptions are of preferred examples for implementing the invention, and the scope of the invention should not necessarily be limited by this description. The scope of the present invention is defined by the following claims.

I claim:

1. A differential mixer circuit for mixing a first differential input signal and a second differential input signal with a first differential mixing signal and a second differential mixing signal to thereby form a first differential output signal and a second differential output signal, the differential mixer circuit comprising:
   a first transconductance amplifier coupled to receive the first differential input signal;
   a second transconductance amplifier positioned in parallel with the first transconductance amplifier and coupled to receive the second differential input signal;
   the first and second transconductance amplifiers being matched with one another to form a matched pair of transconductance amplifiers;
   a first degeneration resistor coupled between the first transconductance amplifier and a common ground to thereby form a first current source resistor;
   a second degeneration resistor coupled between the second transconductance amplifier and the common around to thereby form a second current source resistor;
   the first transconductance amplifier, the second transconductance amplifier, the first degeneration resistor, and the second degeneration resistor forming a Class AB amplifier in which DC bias current changes with changes in the first and second differential input signals, the Class AB amplifier generating a first amplified signal and a second amplified signal;
   a multiplying stage coupled to receive the first and second amplified signals and the first and second differential mixing signals;
   the multiplying stage having a first multiplying portion coupled to the first transconductance amplifier to receive the first amplified signal, and coupled to receive both the first and the second differential mixing signal;
   the multiplying stage having a second multiplying portion coupled to the second transconductance amplifier to receive the second amplified signal, and coupled to receive both the first and the second differential mixing signal;
   the first differential output signal being formed by the first multiplying portion, and the second differential output signal being formed by the second multiplying portion; and
   the first and second differential output signals being substantially linearly related to the first and second differential input signals.

2. The differential mixer circuit of claim 1 wherein:
   the first multiplying portion includes a first mixing transistor and a second mixing transistor coupled together, the first mixing transistor being gated by the first differential mixing signal and the second mixing transistor being gated by the second differential mixing signal; and
   the second multiplying portion includes a third mixing transistor and a fourth mixing transistor coupled together, the third mixing transistor being gated by the first differential mixing signal, and the fourth mixing transistor being gated by the second differential mixing signal.

3. The differential mixer circuit of claim 2 wherein:
   the first and second differential input signals are of a first frequency;
   the first and second differential mixing signals are a second frequency, with the second frequency being less than the first frequency, and
   the first and second differential output signals are of a third frequency, with the third frequency being less than the second frequency.

4. The differential mixer circuit of claim 3 wherein the third frequency is a baseband frequency.

5. The differential mixer circuit of claim 2 wherein:
   the first and second differential input signals are of a first frequency;
   the first and second differential mixing signals are a second frequency, with the second frequency being less than the first frequency, and
   the first and second differential output signals are of a third frequency, with the third frequency being greater than the second frequency.

6. The differential mixing circuit of claim 5 wherein the third frequency is an intermediate frequency.

7. A method of mixing together a first and a second differential input signal with a first and a second differential mixing signal to thereby form a first and a second differential output signal, the method comprising:
   providing a Class AB amplifier having a first transconductance amplifier, having a second transconductance amplifier that is positioned in parallel with the first transconductance amplifier and that is matched to the first transconductance amplifier, having a first degeneration resistor coupled between the first transconductance amplifier and a common ground to thereby form a first current source resistor, and having a second degeneration resistor coupled between the second transconductance amplifier and the common ground to thereby form a second current resistor;
   applying the first differential input signal to the first transconductance amplifier;
   applying the second differential input signal to the second transconductance amplifier;
   such that bias currents change in the first and second transconductance amplifiers with changes in the first and second differential input signals, respectively;
   amplifying the first differential input signal and the second differential input signal within the Class AB amplifier to form a first and a second amplified signal; and
   amplifying the first and second amplified signals by the first and second mixing signal, to thereby form the first and second differential output signals, the first and second differential output signals being substantially linearly related to the first and second differential input signals.

8. The method of claim 7 including the steps of:

providing the first and second differential input signals of a first frequency;

providing the first and second differential mixing signals of a second frequency; and providing the first and second differential output signals of a third frequency, the third frequency being less than the second frequency.

9. The method of claim 7 including the steps of:

providing the first and second differential input signals of a first frequency;

providing the first and second differential mixing signals of a second frequency; and providing the first and second differential output signals of a third frequency, the third frequency being greater than the second frequency.

10. In a radio device having a receiver for receiving a radio signal, the received radio signal being converted to a first differential IF-signal and a second differential IF-signal, a mixer circuit for mixing the first and second differential IF-signals with a first differential mixing signal and a second differential mixing signal, the mixer circuit comprising:

a first transconductance amplifier coupled to receive the first differential IF-signal;

a second transconductance amplifier matched to the first transconductance amplifier, positioned in parallel with said first transconductance amplifier, and coupled to receive the second differential IF-signal;

a first degeneration resistor coupled between the first transconductance amplifier and a common ground to thereby form a first current source resistor;

a second degeneration resistor coupled between the second transconductance amplifier and the common ground to thereby form a second current source resistor;

the first transconductance amplifier, the second transconductance amplifier, the first degeneration resistor, and the second degeneration resistor forming a Class AB amplifier in which DC-bias current changes with changes in the first and second differential radio signals;

the Class AB amplifier generating a first and a second amplified signal;

a first multiplying stage coupled to receive the first amplified signal and the first and second differential mixing signals, and operative to form a first differential down mixed output signal; and a second multiplying stage coupled to receive the second amplified signal and the first and second differential mixing signals, and operative to form a second differential down mixed output signal.

* * * * *